(12) United States Patent
Algieri et al.

(10) Patent No.: US 7,236,915 B2
(45) Date of Patent: Jun. 26, 2007

(54) TECHNIQUE AND INTERFACE FOR COMPUTER SYSTEM RESOURCE ASSIGNMENT

(75) Inventors: Joseph E. Algieri, Santa Clara, CA (US); John Wilkes, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1013 days.

(21) Appl. No.: 09/927,156

(22) Filed: Aug. 9, 2001

(65) Prior Publication Data

US 2003/0033132 A1 Feb. 13, 2003

(51) Int. Cl.
| | |
|---|---|
| *G06F 17/50* | (2006.01) |
| *G06F 9/45* | (2006.01) |
| *G06F 11/30* | (2006.01) |
| *G06F 15/00* | (2006.01) |
| *G06G 7/62* | (2006.01) |
| *G21C 17/00* | (2006.01) |

(52) U.S. Cl. .................. 703/13; 703/22; 702/182; 702/186

(58) Field of Classification Search .................. 703/13, 703/22; 716/2, 11; 707/205; 702/186, 182
See application file for complete search history.

(56) References Cited

U.S. PATENT DOCUMENTS

| | | | | | |
|---|---|---|---|---|---|
| 5,088,058 | A | * | 2/1992 | Salsburg ........................ 703/25 |
| 5,345,579 | A | * | 9/1994 | Hynes ............................ 703/2 |
| 5,640,595 | A | * | 6/1997 | Baugher et al. ................ 710/10 |
| 5,668,995 | A | * | 9/1997 | Bhat .......................... 718/104 |
| 6,086,618 | A | * | 7/2000 | Al-Hilali et al. ................ 703/2 |
| 6,446,239 | B1 | * | 9/2002 | Markosian et al. ............. 716/2 |
| 6,449,761 | B1 | * | 9/2002 | Greidinger et al. ............ 716/11 |
| 6,470,464 | B2 | * | 10/2002 | Bertram et al. ................ 714/37 |
| 6,487,562 | B1 | * | 11/2002 | Mason et al. ................ 707/205 |
| 6,865,527 | B2 | * | 3/2005 | Go et al. ........................ 703/22 |
| 7,058,560 | B1 | * | 6/2006 | Arakawa et al. ............... 703/22 |

OTHER PUBLICATIONS

Juran on Quality by Design, by J. M. Juran, The Free Press, 1992, ISBN 0-02-916683-7, p. 462-467 on Taurus.*
HDL Chip Design, by Douglas J. Smith, 1996, Ninth printing 2001 minor updates, ISBN 0-9651934-3-8, pp. 2-19.*
The Visual Display of Quantitative Information, Edward Tufte, Graphics Press, 1983, p. 126.*

* cited by examiner

*Primary Examiner*—Paul Rodriguez
*Assistant Examiner*—Dwin McTaggart Craig

(57) ABSTRACT

A technique and user interface for the assignment of computer system resources and, particularly, for the assignment of storage system resources. The invention allows a user to make design selections through a user interface and, then, automatically provides an indication to the user as the effect of the selections. For example, various performance parameters for each of several applications may be displayed graphically as a chart. In response to the user adjusting a parameter for one application, the invention determines what effect this change will have on the other displayed parameters. A design for the computer system is developed. Levels of performance parameters for the design are predicted. The predicted levels of performance parameters are compared to the desired levels of performance parameters. When the predicted levels are lower than the desired levels, the design is modified. The design may be modified by reducing the desired levels of performance parameters based on utility functions. The results may then be displayed graphically on the chart. The invention is particularly useful for allocating data storage system resources among several different applications.

30 Claims, 4 Drawing Sheets

TECHNIQUE AND INTERFACE FOR COMPUTER SYSTEM RESOURCE ASSIGNMENT

FIELD OF THE INVENTION

The present invention relates to the field of design of computer systems and data storage systems. More particularly, the present invention relates to the field of techniques and user interfaces for the design and configuration of computer systems and data storage systems.

BACKGROUND OF THE INVENTION

A computer system including a data storage system may be designed and configured for a specific application. This generally requires that a skilled designer rely on experience while making design choices based on requirements for the storage system and on possible memory devices to be incorporated into the storage system. Particularly, a variety of different memory devices form the building blocks of modern data storage systems. Specific devices can be based on, for example, optical, magnetic and/or electronic storage technologies and may include solid-state memory devices, magnetic tape drives and optical or magnetic disk drives and arrays. Memory devices can be further characterized, for example, by capacity, levels or types of redundancy provided (e.g., RAID-1 or RAID-5), bandwidth, cost, latency (e.g., read latency and/or write latency), and whether they are read and write capable, read-only capable, dynamic, static, volatile or non-volatile.

Additionally, storage capacity and other resources of the data storage system may be assigned to one or more applications that are to be served by the data storage system. For example, various data elements, such as files or databases, may be placed in a storage system in a number of different ways. One form of this may be referred to as the "bin-packing problem," the goal of which is to fit data elements of various different sizes into storage devices of given sizes, while minimizing wasted space. The assignment task quickly becomes more complicated, however, when one attempts to apply additional constraints. For example, certain applications may have minimum requirements in terms of storage capacity, access times and so forth.

Since storage system resources are most often limited, the design process typically includes making a number of trade-offs with respect to the system resources. Further, design trade-offs that are appropriate in one context may not be appropriate in other contexts. For example, in a storage system for serving Internet downloads, high bandwidth and fault tolerance may be priorities, whereas, in a storage system for archiving data records, low cost and low power consumption may be priorities. However, the effects of some trade-offs may not be readily apparent, particularly where a single storage system serves multiple different applications. For example, when storage system resources are allocated to one application, the effect this will have on other applications served by the storage system may not always be readily apparent, even to a skilled designer.

Modeling tools are known for predicting the performance of data storage systems. However, the capabilities of such modeling tools are limited. For example, they do not provide a solution when predicted performance falls short of requirements.

Because specialized skills are required to design and configure a storage system, including assigning storage system resources to applications and verifying that the design meets requirements, such specially-designed storage systems tend to be expensive. Further, due to lack of a systematic approach, the design process can be time consuming and may yield a less-than-optimal result.

Accordingly, it would be desirable to provide a technique for the design and configuration of a data storage system that is more systematic, more likely to yield optimal results and that is less time-consuming than conventional design techniques.

SUMMARY OF THE INVENTION

The present invention is a technique and user interface for the design and configuration of computer systems and, particularly, for the assignment of data storage system resources. The invention allows a user to make design selections and, then, automatically provides an indication to the user of the effect of the selections. For example, various performance parameters for each of several applications served by a storage system may be displayed graphically as a chart. In response to the user adjusting a parameter for one application, the invention determines what effect this change will have on the other displayed parameters. The effects may then be displayed graphically in the chart. The invention is particularly useful for allocating data storage system resources among several different applications.

In one aspect of the invention, a method of and an apparatus for assigning resources for a computer system design are provided. Desired levels of specified performance parameters for a computer system design are received from a user via a user interface to a computer system. The design is developed. Levels of performance parameters for the design are predicted. The predicted levels of performance parameters are compared to the desired levels of performance parameters. When the predicted levels are lower than the desired levels, the design is modified by the computer system.

The computer system design may include a design for data storage system. Developing the computer system design may include assigning system resources to applications to be served by the design. A design tool operating on a computer system may perform the assigning. The design may be modified by reducing the desired levels of performance parameters. The reductions to the desired performance parameters may be based on utility functions which may be received via the user interface to the computer system. The user interface may be a graphical user interface. For example, the user may manipulate heights of bar graphs shown on a display of the computer system to specify the desired levels. Each bar graph may include indicia of the corresponding desired level of the performance parameter and indicia of the corresponding predicted level of the performance parameter. For example, different colors may be used to indicate the level of each.

Predicting the performance of the design and comparing its predicted performance may be repeated after the design is modified. In addition, the user may be notified when the predicted levels are lower than the desired levels after the design is modified.

The invention provides an easy-to-use technique for assigning resources in a data storage system based on desired levels of performance and on utility information provided by the user.

DETAILED DESCRIPTION OF A PREFERRED EMBODIMENT

The present invention provides a technique and user interface for the design and configuration of computer systems and, particularly, for the assignment of data storage system resources. A user, such as a system designer or administrator, is typically provided with a set of applications (e.g., software applications) that require resources of a computer system and, particularly, its data storage system resources. Thus, a single computer (or storage system) may serve one or more applications. Each application will generally have requirements, such as those relating to bandwidth, request rates, response times, and so forth. The resources of the computer system and, particularly, data storage system resources, such as disks, cache memory, parity groups, back-end bus traffic, and so forth, are to be assigned to the applications in an attempt to meet the requirements of each application.

The invention provides an interface, such as via a computer system monitor, mouse and keyboard, through which the user may receive certain information regarding the design for the computer system, its configuration and its predicted performance. The term "performance" is used herein in its ordinary sense and includes parameters that tend to characterize the system, such as its size, weight, power consumption, availability, cost, bandwidth, latency, and so forth. Information may be provided to the user in numeric or graphic form and may be displayed on the computer monitor. As an example of a numeric display, a table or spreadsheet that includes various data storage system parameters that may be displayed to the user. As an example of a graphic display, a chart or graph may displayed which represents the various parameters. In addition, the user may provide input which affects the design, configuration and performance of the computer system under design. The input may be provided by the user via the mouse and/or keyboard of the computer system.

Figure 1:
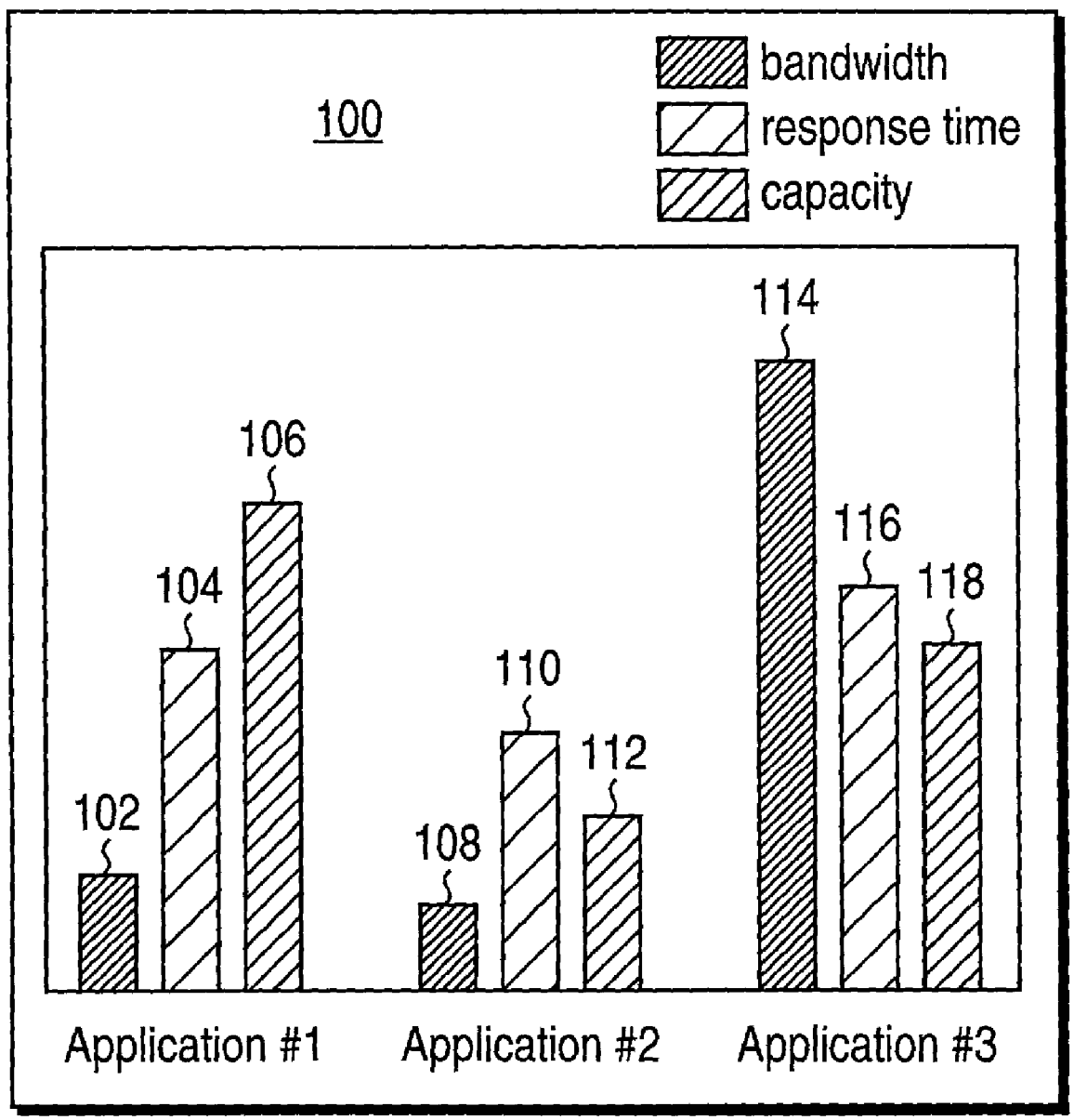
FIG. 1 illustrates an exemplary graphic display in accordance with the present invention.

FIG. 1 illustrates an exemplary graphic display 100 in accordance with the present invention. As shown in FIG. 1, parameters of three applications (Application #1, Application #2 and Application #3) are represented as vertical bars 102-118 where the height of a bar indicates the value of the corresponding parameter. The parameters shown in FIG. 1 include bandwidth, response time and capacity; however, it will be apparent that other parameters may be selected. As shown in FIG. 1, vertical bar 102 may represent the amount of bandwidth allocated to Application #1; vertical bar 104 may represent the response time for read or write requests initiated by Application #1 and vertical bar 106 may represent the amount of storage capacity allocated to Application #1. Similarly, vertical bars 108-112 may represent parameters for Application #2, while vertical bars 114 may represent parameters for Application #3. As explained herein, the displayed levels may be desired levels and/or predicted levels.

It will be apparent that the arrangement of the display 100 of FIG. 1 is exemplary and that other arrangements may be selected. For example, other parameters, such as request rate or throughput may be displayed. As another example, parameters for the applications may be represented by one or more pie charts or tables. Preferably, the displayed parameters represent measures of performance that are relevant to the applications served by the computer system or data storage system under design.

As mentioned, the user may also provide input via the display 100. In one embodiment, the user may position a cursor over a selected one of the vertical bars 102-118, depress control key, such as a mouse button, and then lengthen or shorten the bar by moving the cursor (this technique may be referred to as "clicking and dragging"). Alternate input may also be accepted, such as by the user typing desired numeric values for selected parameters. Accordingly, the invention provides an interface that is easy-to-use in that it readily displays relevant information and easily accepts input from the user.

The parameters shown on the display 100 relate to applications to be served by a computer or data storage system that may be under design. Thus, in response to a user changing the displayed parameters, the design may be altered to accommodate the change. For example, the storage system design may only have a specified total amount of capacity. Accordingly, if the user changes the capacity parameter for Application #1, this may affect the storage capacity available to Applications #2 and #3. A design tool may be employed to make modifications to the design.

The altered design may then be evaluated to determine whether it still meets the requirements of the applications served by the storage system. The user may then be informed of the results (e.g., whether the change is met with success or failure). For example, if the user increases the capacity parameter for Application #1 and this increase results in a reduction of the capacity available to Applications #2 and #3 such that their capacity requirements may still be met using a modified design, the display 100 may be updated to reflect new capacity parameters for Applications #2 and #3. Alternately, if this increase would not leave sufficient capacity for either Application #2 or #3, then a message may appear on the display 100 to inform the user of this. For example, the message: "insufficient resources available" may appear. Further, the parameters for which the application requirements could not be met may change color on the display 100. In addition, how much of the requirement that could not be met may be represented by using two colors: one showing the amount of a parameter available to an application and the other showing a difference between the amount of the parameter available and the minimum requirement for the application.

In one embodiment, if a desired change to a parameter for an application is met with failure, the requirements for the other applications may be modified in order to accommodate the user's desired changes. However, to accomplish this, certain trade-offs may have to be made to the performance goals for the applications. One approach is to reduce the corresponding delivered performance parameter for all the other applications evenly (e.g., by the same percentage or amount). For example, assume that the user desires to increase the capacity of Application #1, which requires freeing up three Gigabytes. Assume also that Application #2 has a requirement of ten Gigabytes and that Application #3 has a requirement of twenty Gigabytes. Under these circumstances, one option is to reduce the requirement of Application #2 by one Gigabyte (i.e. 10% of ten Gigabytes) and to reduce the requirement of Application #3 by two Gigabytes (i.e. 10% of twenty Gigabytes). Another option is to reduce the capacity requirement for each of Applications #2 and #3 by the same amount (one and one-half Gigabytes).

Another approach is to reduce only the requirement for the application whose requirement is highest. For example, assume that the user desires to increase the capacity of Application #1 by three Gigabytes. Assume also that Application #2 has a requirement of ten Gigabytes and that Application #3 has a requirement of twenty Gigabytes. Under these circumstances, one option is to reduce the requirement of Application #3 by the entire three Gigabytes since Application #3 has the highest requirement. This approach will tend to reduce the requirements of the other applications to the same level. Thus, if the capacity requirement for Application #3 is reduced to ten Gigabits, then any further reductions may be shared equally by Applications #2 and #3.

When confronted with a failed attempt, the user may be provided the ability to select from one of these schemes for trading-off the levels of performance parameters. Alternately, one approach may be pre-selected and, thus, may be performed without further input from the user.

Still another approach is to obtain input from the user regarding the relative importance of the requirements or goals for each application. For example, the user may specify certain "utility functions" for each parameter. A utility function represents how much utility (or value) is attached to various levels of the performance parameters.

Figure 2C:
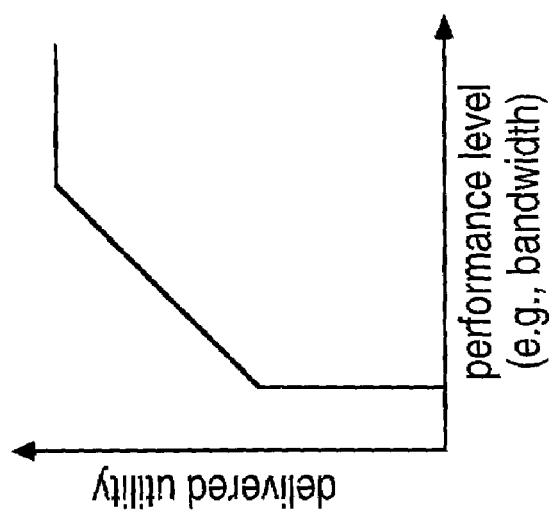
FIGS. 2A-C illustrate exemplary utility functions in accordance with the present invention.
Figure 2B:
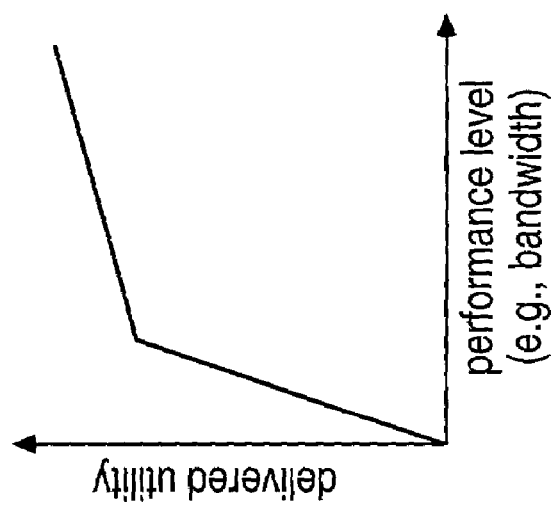
Figure 2A:
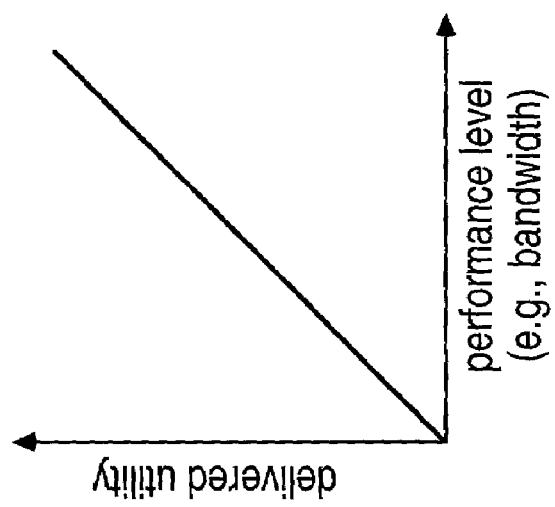

FIGS. 2A-C illustrate exemplary utility functions in accordance with the present invention. As shown in FIGS. 2A-C, each utility function may be represented as a function in two-dimensions with a performance parameter (e.g., bandwidth) on the X-axis and a corresponding delivered utility on the Y-axis. More particularly, FIG. 2A illustrates that the user has determined that for a particular application and performance parameter, utility is proportional to bandwidth. In other words, the faster this application operates, the greater the utility. Thus, FIG. 2A illustrates a linear relationship between the performance parameter and its utility.

FIG. 2B illustrates a situation in which the user has determined that the faster the application operates, the greater the utility except that once the bandwidth reaches a certain point, additional bandwidth is less useful. Thus, FIG. 2B illustrates a linear relationship between the performance parameter and its utility, except that the slope is reduced after a certain level of the parameter is reached. An example suitable for this function may be an order entry system. This is because an ability to handle normal ordering traffic is very important. It would also be helpful, but not as important, to also have an ability to handle peak loads.

FIG. 2C illustrates a situation in which there is no utility below a certain bandwidth, but that once that level is reached, a certain level of utility is achieved. This first level of utility is shown in FIG. 2C by vertical portion of the curve. Then, as bandwidth increases, so does utility. This is shown by the sloping portion of the curve. When a certain point is reached, utility no longer increases. This is shown by the horizontal portion of the curve. An example suitable for this function may be a video server. This is because the lowest bandwidth may be necessary for minimal image quality. As the bandwidth goes up, so does image quality. However, a point is eventually reached where the storage system is no longer the limiting factor on image quality.

It will be apparent that the utility functions illustrated in FIGS. 2A-C are exemplary and that other functions may be selected. Further, utility functions may be multi-dimensional. For example, the utility of certain performance parameters, such as bandwidth and response time, may be interdependent.

As explained herein, by specifying utility functions, desirable trade-offs can be made when resources are limited, without requiring further input from the user. More particularly, given user-specified relationships between utility and levels of certain performance parameters, appropriate trade-offs can be made so as to maximize the utility provided while allocating limited resources.

Figure 3:
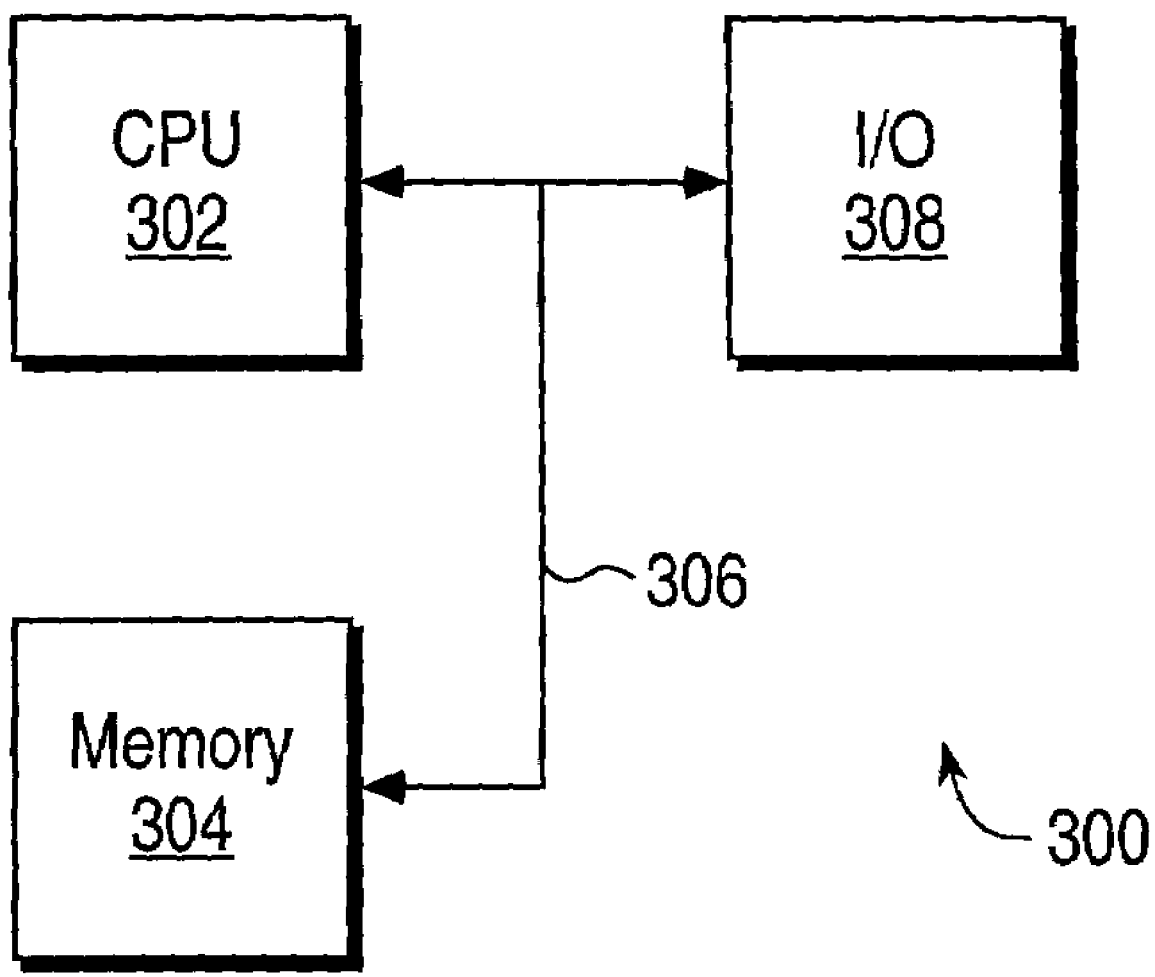
FIG. 3 illustrates a block schematic diagram of a general-purpose computer system by which the present invention may be implemented.

FIG. 3 illustrates a block schematic diagram of a general-purpose computer system 300 by which the present invention may be implemented. The computer system 300 may include a general-purpose processor 302, a memory 304, such as persistent memory (e.g., a hard disk for program memory) and transitory memory (e.g., RAM), a communication bus 306, and input/output devices 308, such as a keyboard, monitor and mouse. The computer system 300 is conventional. As such, it will be apparent that the system 300 may include more or fewer elements than shown in FIG. 3 and that other elements may be substituted for those illustrated in FIG. 3. Software for implementing the present invention, such as assigning data storage system resources in accordance with the present invention and for providing the user interface of the present invention, may be stored in the memory 304 in accordance with the present invention. Further, the display 100 of FIG. 1 may be provided by the monitor 308 of the system 300.

Figure 4:
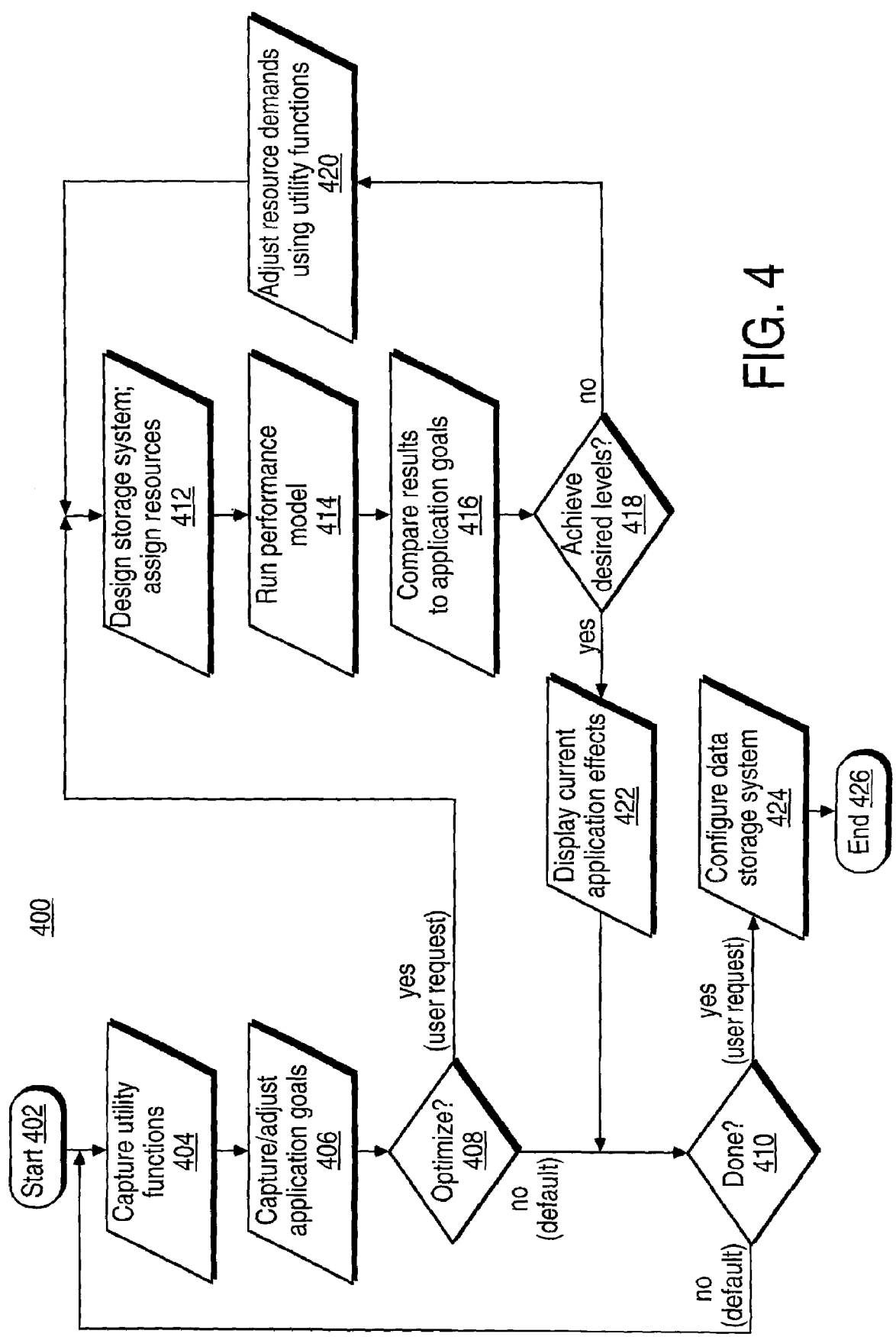
FIG. 4 illustrates a flow diagram of a process for assigning system resources in accordance with the present invention.

FIG. 4 illustrates a flow diagram 400 of a process for assigning resources for a computer system design in accordance with the present invention. As mentioned, a software program which implements the process of FIG. 4 may be stored in the memory 304 of the computer system 300 of FIG. 3 for causing the processor 302 to perform the steps of the process. Accordingly, the process is preferably performed automatically, such as by the computer system 300, however, it will be apparent that one or more of the steps may be performed manually.

Referring to FIG. 4, program flow begins in a start state 402. From the state 402, program flow moves to a state 404. In the state 404, the user may specify a scheme for trading-off system resources should the need arise. For example, utility functions, such as those illustrated in FIGS. 2A-C, may be captured and stored for later use (e.g., in the memory 304 of FIG. 3). Thus, the user may specify the utility functions for various performance parameters of each application to be served by the computer or data storage system under design. Alternately, the user may select from a number of pre-configured utility functions. For example, the utility functions illustrated in FIGS. 2A-C may be displayed on the display 100 (FIG. 1) along with a menu of applications and performance parameters. Then, the user may select appropriate ones by "clicking" on them.

From the state 404, program flow moves to a state 406 in which application goals may be captured and/or modified. In addition to the utility functions, the desired levels of performance parameters may be stored in the memory 304 of the computer 300. For example, the user may specify desired measures of performance for each application by making selections from a menu shown on the display 100 (FIG. 1). As shown in FIG. 1, the selections may include bandwidth, response time, capacity and so forth. In the state 406, the user may also set desired levels for each selection. For example, the user may click and drag the bars 102-118 (FIG. 1) to the desired levels.

From the state 406, program flow moves to a state 408. In the state 408, a determination may be made as to whether to modify the design of the system based on the utility functions set in the state 404 and/or the performance levels set in the state 406. In one embodiment, this determination is made by the user; if no affirmative input from the user is provided, then the default condition is a negative determination. In which case, program flow moves to a state 410.

In the state 410, a determination may be made as to whether to finalize the current design of the computer or storage system. In one embodiment, this determination is made by the user; if no affirmative input from the user is provided, then the default condition is a negative determination. In which case, program flow returns to the state 404.

Accordingly, program flow remains in a loop which includes the states 404, 406, 408 and 410 until the user decides to either modify the design or finalize the current design. While in the loop, the user may make as many changes to the utility functions (in state 404) or to the performance levels (in state 406) as desired.

Once the user decides to modify the design, program flow moves from the state 408 to a state 412. In the state 412, a design tool may be invoked to develop a design for the computer or its storage system based on the desired performance levels. Any suitable conventional design tool may be used for this purpose, such as a computer-aided design tool. In a preferred embodiment, the design tool is similar to the one disclosed in co-pending U.S. patent application Ser. No. 09/924,735, of Eric Anderson, filed on Aug. 7, 2001, and entitled "SIMULTANEOUS ARRAY CONFIGURATION AND STORE ASSIGNMENT FOR A DATA STORAGE SYSTEM," the contents of which are hereby incorporated by reference. Further, manual design techniques may be employed in the state 412, such that the system is designed completely or partially "by hand."

From the state 412, program flow moves to a state 414 in which a performance modeling tool may be invoked in order to characterize the design developed in the state 412. The tool invoked in the state 414 preferably provides a prediction of the actual levels of performance that may be achieved by the design developed in the state 412. For example, if one of the performance goals specified in the state 406 is bandwidth, then the tool invoked in the state 414 preferably provides a predicted level of bandwidth for the design developed in the state 412. The tool invoked in the state 412 may be any suitable conventional modeling tool. In a preferred embodiment, the modeling tool is similar to the one disclosed in co-pending U.S. patent application Ser. No. 09/843,903, filed Apr. 30, 2001, of Mustafa Uysal et al., and entitled "Method and Apparatus for Morphological Modeling of Complex Systems to Predict Performance," the contents of which are hereby incorporated by reference. Further, manual modeling techniques may be employed in the state 414, such that the system is modeled completely or partially "by hand." Also, actual performance of a data storage system may be measured in the state 406.

From the state 414, program flow moves to a state 416. In the state 416, a comparison may be made between the desired levels of the performance parameters set in the state 406 and the levels achieved in the state 414. From the state 416 program flow moves to a state 418 where a determination may be made as to the results of the comparison performed in the state 416. If the desired levels were not achieved, then program flow may move to a state 420.

In the state 420, the performance levels set in the state 406 may be adjusted based on the utility functions set in the state 404. Thus, where resources of the storage system are limited, trade-offs can be made in the state 420. For example, assuming the total available storage capacity of the storage system under design is exceeded by the amount of capacity the user desires to provide to each application, a trade-off will have to be made. If the utility function for one of the applications is flat (horizontal) beyond a certain capacity level (e.g., similar to the curve in FIG. 2C), this means that the capacity allocated to that application can be reduced to that level in the state 420 with no loss of utility. As another example, if all the applications have the same utility function for capacity as shown in FIG. 2A (and with the same slope), then the capacity for each may be reduced by the same amount in the state 420. Numerous other trade-offs relative to the limited resource can be made in the state 420.

From the state 420, program flow may return to the state 412. Then, the newly adjusted performance levels (in state 420) may be used to develop a new design for the computer or storage system (in state 422) and newly achieved performance results compared to the desired performance levels 416. This program loop (including states 420, 412, 414, 416 and 418) may continue until the desired levels are achieved. Thus, if in the state 420, it is determined that the desired performance levels (as set in the state 404 or modified in the state 420), are met, then program flow may move from the state 420 to a state 422.

In the state 422, the current performance levels that can be achieved (as predicted in state 416) may be shown on the display 100 (FIG. 1). From the state 422, program flow returns to the first loop (including states 402, 404, 406, 408 and 410) where the user may make further adjustments to the utility functions (404) and the desired performance levels (state 406).

Note that when program flow is in the loop that includes states 420, 412, 414, 416 and 418, with each pass through the loop beyond two or three passes, it is becomes increasingly less likely that the desired performance goals can be met without making more drastic trade-offs. Thus, rather than making such drastic tradeoffs in the state 420, program flow may return to the first loop (including states 402, 404, 406, 408 and 410) where the user may make these trade-offs manually by changing the utility functions and/or the desired performance levels. Under these circumstances, the levels displayed in the state 422 may show how much of a requirement that could not be met such as by using two colors, as explained above in reference to FIG. 1.

When a satisfactory design is achieved and the user no longer wishes to make any additional changes, the user may indicate that the process is complete. For example, the user may click on an icon on the display 100 labeled "done." Then, program flow moves from the state 410 to a state 424. In the state 424, the design may be completed. For example, a physical data storage system may be configured as indicated by the design tool invoked in the state 412. From the state 424, program flow may terminate in a state 426.

While the foregoing has been with reference to particular embodiments of the invention, it will be appreciated by those skilled in the art that changes in these embodiments may be made without departing from the principles and spirit of the invention, the scope of which is defined by the appended claims.

What is claimed is:

1. A method of assigning resources for a computer system design comprising:

receiving desired levels of performance parameters for a computer system design from a user via a user interface to a computer system, the design including assignments of system resources to applications;

modifying the design in response to said desired levels including modifying the assignments of the system resources;

predicting levels of performance parameters for the modified design; and displaying for the user an indication of the predicted levels of performance parameters for the modified design via the user interface.

2. The method according to claim 1, wherein the computer system design comprises a design for a data storage system.

3. The method according to claim 1, further comprising reducing one or more of the performance parameters from said desired levels of performance parameters.

4. The method according to claim 3, wherein said reducing is based on at least one utility function representing utility as a function of one or more of the performance parameters.

5. The method according to claim 4, further comprising:

receiving the at least one utility function via the user interface to the computer system; and storing the at least one utility function in a memory device of the computer system.

6. The method according to claim 1, wherein the desired levels of performance parameters are specified by the user through a graphical user interface.

7. The method according to claim 1, wherein the desired levels of performance parameters are specified by the user through a graphical user interface by the user manipulating heights of bar graphs shown on a display of the computer system.

8. The method according to claim 7, wherein each bar graph indicates the corresponding desired level of the performance parameter.

9. The method according to claim 8, wherein each bar graph also indicates the corresponding predicted level of the performance parameter.

10. A method of assigning resources for a computer system design comprising:

receiving desired levels of performance parameters for a computer system design from a user via a user interface to a computer system;

developing the design including assignments of system resources to applications;

predicting levels of performance parameters for the design;

comparing the predicted levels of performance parameters to the desired levels of performance parameters;

modifying the design including modifying the assignments of the system resources when the predicted levels are lower than the desired levels, said modifying being performed by the computer system; and displaying for the user results of the modifying via the user interface.

11. The method according to claim 10, wherein the computer system design comprises a design for a data storage system.

12. The method according to claim 10, wherein said developing comprises assigning system resources to applications to be served by the design.

13. The method according to claim 12, said assigning being performed by a design tool operating on the computer system.

14. The method according to claim 10, further comprising reducing one or more of the performance parameters from said desired levels of performance parameters.

15. The method according to claim 14, wherein said reducing is based on at least one utility function representing utility as a function of one or more of the performance parameters.

16. The method according to claim 15, further comprising receiving the at least one utility function via the user interface to the computer system.

17. The method according to claim 10, wherein the user interface is a graphical user interface.

18. The method according to claim 17, wherein the desired levels of performance parameters are specified by the user through the graphical user interface by the user manipulating heights of bar graphs shown on a display of the computer system.

19. The method according to claim 18, wherein each bar graph indicates the desired level of the corresponding performance parameter.

20. The method according to claim 19, wherein each bar graph also indicates the predicted level of the corresponding performance parameter.

21. The method according to claim 10, further comprising repeating said steps of predicting and comparing after said modifying.

22. The method according to claim 21, wherein when the predicted levels are lower than the desired levels after said modifying, then notifying the user.

23. An apparatus for assigning resources for a computer design system, comprising a computer programmed to operate in a first program loop in which a user specifies desired levels of performance parameters of the design, the design including assignments of system resources to applications, via a user interface and a second program loop in which: performance parameters are compared to the desired levels of performance parameters; the design is modified, including modifying the assignments of system resources to applications, in response to the comparison and results of the modifying are displayed for the user via the user interface.

24. The apparatus according to claim 23, wherein the computer system design comprises a design for a data storage system.

25. The apparatus according to claim 23, wherein one or more of the performance parameters is reduced from said desired levels of performance parameters based on at least one utility function representing utility as a function of one or more of the performance parameters.

26. The apparatus according to claim 25, wherein the at least one utility function is specified by the user.

27. The apparatus according to claim 23, wherein the desired levels of performance parameters are specified by the user through a graphical user interface.

28. The apparatus according to claim 27, wherein the desired levels of performance parameters are specified by the user through the graphical user interface by the user manipulating heights of bar graphs shown on a display of the computer system.

29. The apparatus according to claim 28, wherein each bar graph indicates the desired level of the corresponding performance parameter.

30. The apparatus according to claim 29, wherein each bar graph also indicates the predicted level of the corresponding performance parameter.

* * * * *